(12) United States Patent
Yoo (10) Patent No.: US 10,475,924 B2
(45) Date of Patent: Nov. 12, 2019

(54) FERROELECTRIC MEMORY DEVICES (71) Applicant: SK hynix Inc., Icheon-si (KR)

(72) Inventor: Hyangkeun Yoo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/976,826

(22) Filed: May 10, 2018

(65) Prior Publication Data
US 2018/0358471 A1 Dec. 13, 2018

(30) Foreign Application Priority Data
Jun. 8, 2017 (KR) .................. 10-2017-0071605

(51) Int. Cl.
| | |
|---|---|
| *H01L 29/78* | (2006.01) |
| *H01L 27/1159* | (2017.01) |
| *H01L 45/00* | (2006.01) |
| *H01L 29/51* | (2006.01) |
| *G11C 11/22* | (2006.01) |
| *G11C 11/56* | (2006.01) |
| *G11C 13/00* | (2006.01) |

(52) U.S. Cl.
CPC ...... *H01L 29/78391* (2014.09); *G11C 11/223* (2013.01); *G11C 11/2273* (2013.01); *G11C 11/2275* (2013.01); *G11C 11/5657* (2013.01); *G11C 13/0002* (2013.01); *G11C 13/0004* (2013.01); *G11C 13/0007* (2013.01); *G11C 13/0011* (2013.01); *H01L 27/1159* (2013.01); *H01L 29/516* (2013.01); *H01L 45/06* (2013.01); *H01L 45/08* (2013.01); *H01L 45/085* (2013.01); *H01L 45/1233* (2013.01); *H01L 45/142* (2013.01); *H01L 45/143* (2013.01); *H01L 45/144* (2013.01); *H01L 45/146* (2013.01); *H01L 45/147* (2013.01); *G11C 2213/15* (2013.01); *H01L 45/141* (2013.01)

(58) Field of Classification Search
CPC .................................................. H01L 29/78391
See application file for complete search history.

(56) References Cited

U.S. PATENT DOCUMENTS

| | | | | |
|---|---|---|---|---|
| 5,119,329 | A * | 6/1992 | Evans, Jr. | G11C 11/22 365/100 |
| 6,194,751 | B1* | 2/2001 | Evans, Jr. | H01L 27/11502 257/295 |
| 6,225,655 | B1* | 5/2001 | Moise | G11C 29/44 257/295 |
| 7,098,496 | B2 | 8/2006 | Li et al. | |
| 9,679,893 | B2* | 6/2017 | Yan | H01L 27/0711 |
| 2004/0061153 | A1* | 4/2004 | Misewich | G11C 11/22 257/295 |
| 2006/0145240 | A1* | 7/2006 | Park | G11C 11/005 257/315 |
| 2010/0054111 | A1* | 3/2010 | Zhao | G11B 9/02 369/126 |

(Continued)

FOREIGN PATENT DOCUMENTS

KR 10-2013-0111754 A 10/2013

*Primary Examiner* — William A Harriston (57) ABSTRACT

A ferroelectric memory device includes a substrate, a ferroelectric layer, a variable resistive memory layer and a gate electrode which are sequentially stacked on a surface of the substrate. The ferroelectric layer has any one of a plurality of different remanent polarization values depending on a resistive state of the variable resistive memory layer.

8 Claims, 7 Drawing Sheets (56) References Cited

U.S. PATENT DOCUMENTS

| | | | | |
|---|---|---|---|---|
| 2010/0097832 A1* | 4/2010 | Mukai | ............... | G11C 7/18 |
| | | | | 365/51 |
| 2013/0094280 A1* | 4/2013 | Widjaja | ............... | G11C 11/4072 |
| | | | | 365/148 |
| 2014/0293677 A1* | 10/2014 | Kim | ............... | G11C 13/0002 |
| | | | | 365/148 |
| 2016/0079363 A1* | 3/2016 | Lee | ............... | H01L 29/0847 |
| | | | | 711/104 |
| 2016/0358975 A1* | 12/2016 | Kim | ............... | H01L 45/1641 |
| 2016/0359109 A1* | 12/2016 | Kamimuta | ............... | H01L 45/04 |

* cited by examiner

FERROELECTRIC MEMORY DEVICES

CROSS-REFERENCE TO RELATED APPLICATIONS

The present application claims priority under 35 U.S.C 119(a) to Korean Application No. 10-2017-0071605, filed on Jun. 8, 2017, which is herein incorporated by reference in its entirety.

BACKGROUND

1. Technical Field

The present disclosure generally relates to ferroelectric memory devices.

2. Related Art

In general, a ferroelectric material may have spontaneous polarization in the absence of an external electric field. In addition, the ferroelectric material may be controlled to have any one of two stable remanent polarizations, which are opposite to each other on a hysteresis loop, when the ferroelectric material is subject to an external electric field. Accordingly, ferroelectric materials are attractive candidates for employment in nonvolatile memory cells that store data corresponding to a logic "0" and a logic "1".

Recently, a lot of effort has been focused on developing nonvolatile memory devices including multi-level cells that are capable of storing at least two-bit data. Accordingly, attempts to realize such ferroelectric memory devices with the capability of storing multi-level data have been focused on increasing integration density in the ferroelectric memory devices. The inclusion of multi-level cells in ferroelectric memory devices may be realized by controlling or modifying a polarization direction in ferroelectric materials employed in the ferroelectric memory cells.

SUMMARY

According to an embodiment, there is provided a ferroelectric memory device. The ferroelectric memory device may include a substrate, ferroelectric layer, a variable resistive memory layer and a gate electrode which are sequentially stacked on a surface of the substrate. The ferroelectric layer may have any one of a plurality of different remanent polarization values depending on a resistive state of the variable resistive memory layer.

According to another embodiment, there is provided a ferroelectric memory device. The ferroelectric memory device may include a ferroelectric layer, a variable resistive memory layer and a gate electrode which are sequentially stacked on a surface of a substrate. A source region and a drain region may be disposed in the substrate to be spaced apart from each other. The ferroelectric layer, the variable resistive memory layer and the gate electrode may be sequentially stacked on the substrate between the source region and the drain region.

DETAILED DESCRIPTION OF THE EMBODIMENTS

Various embodiments of the present disclosure will now be described more fully hereinafter with reference to the accompanying drawings. In the drawing figures, the dimensions (e.g., widths or thicknesses) of components (e.g., layers or regions) may be exaggerated for clarity of illustration. It will be understood that when an element is referred to as being "on" another element, it can be directly "on" the other element or intervening elements may also be present. In the drawings, like reference numerals refer to like elements throughout.

As used herein, the singular terms "a," "an" and "the" are intended to include the plural forms as well, unless the context clearly indicates otherwise. It will be understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof. Furthermore, in method embodiments such as fabrication method embodiments, process steps of the methods may be performed in different sequences from the order which is described in the specification unless the context clearly indicates otherwise. That is, the process steps of the methods may be performed in the same sequence as described in the specification or in an opposite sequence thereto. Moreover, two or more process steps sequentially performed in an embodiment may be simultaneously performed in another embodiment.

In the present specification, the terms "low resistive state" and "high resistive state" merely mean relative resistive states for distinguishing two different resistive states without denoting any specific resistance values.

Figure 1:
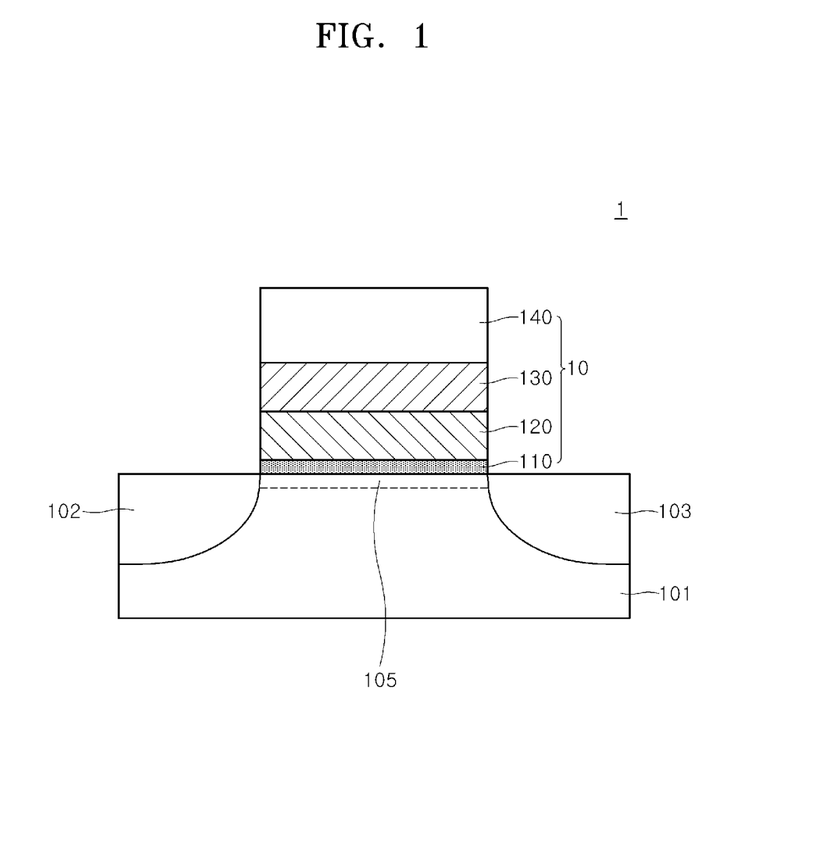
FIG. 1 is a cross-sectional view illustrating a ferroelectric memory device according to an embodiment of the present disclosure.

FIG. 1 is a cross-sectional view illustrating a ferroelectric memory device 1 according to an embodiment of the present disclosure. Referring to FIG. 1, the ferroelectric memory device 1 may include a substrate 101 and a gate pattern 10 disposed on a portion of the substrate 101. The substrate 101 may include a source region 102 and a drain region 103 which are spaced apart from each other. In such a case, the gate pattern 10 may be disposed on the substrate 101 between the source region 102 and the drain region 103. The gate pattern 10 may include a ferroelectric layer 120, a variable resistive memory layer 130 and a gate electrode 140 which are sequentially stacked on the substrate 101. An upper portion of the substrate 101 between the source region 102 and the drain region 103 may be defined as a channel region 105. Thus, the channel region 105 may be located in the substrate 101 under the gate pattern 10. The channel region 105 may have various channel resistances, or different conductivity types, depending on the degree of remanent polarization in the ferroelectric layer 120. Accordingly, ferroelectric memory device 1 may have a channel resistance value according to carriers induced in the channel region 105 when the device operates as a transistor-type memory element. In some embodiments, the gate pattern 10 of ferroelectric memory device 1 may further include an interfacial insulation layer 110 disposed between the substrate 101 (i.e., the channel region 105) and the ferroelectric layer 120.

The substrate 101 may include a semiconductor material. For example, the substrate 101 may include a silicon (Si) substrate, a gallium arsenide (GaAs) substrate, an indium phosphide (InP) substrate, a germanium (Ge) substrate or silicon germanium (SiGe) substrate. In an embodiment, the substrate 101 may be a doped substrate. For example, the substrate 101 may be a P-type doped substrate. In another embodiment, the substrate 101 may include a P-type well surrounding the channel region 105. In yet another embodiment, the substrate 101 may be an intrinsic semiconductor substrate.

The interfacial insulation layer 110 may be disposed on the substrate 101. The interfacial insulation layer 110 may suppress material diffusion between the substrate 101 and the ferroelectric layer 120. In addition, the interfacial insulation layer 110 may suppress or reduce carriers drifting in the channel region 105 from movement, tunneling or injection into the ferroelectric layer 120 during a read operation of the ferroelectric memory device 1. In some other embodiments, if an internal defect density of the ferroelectric layer 120 is low, e.g. lower than a predetermined value, and an interface between the substrate 101 and the ferroelectric layer 120 has a stable state, then the interfacial insulation layer 110 may be omitted.

The ferroelectric layer 120 may be disposed on a surface of the interfacial insulation layer 110 above to the substrate 101. The ferroelectric layer 120 may have a thickness of approximately five (5) nanometers (nm) to approximately fifteen (15) nm. The ferroelectric layer 120 may include a ferroelectric material having remanent polarization. Depending on the degree of remanent polarization in the ferroelectric layer 120, carriers such as electrons and/or holes may be induced to move into or out of the channel region 105 during a read operation of the ferroelectric memory device 1. For example, electrons may be induced in the channel region 105 when a positive bias is applied to the gate electrode 140. Alternatively, the electrons may be repelled out of the channel region 105 and/or holes may be induced in the channel region 105 when a negative bias is applied to the gate electrode 140. A resistance value of the channel region 105 may be determined according to a concentration and a polarity of the carriers induced in the channel region 105, which is in turn influenced by the remanent polarization in ferroelectric layer 120. In an embodiment, if the ferroelectric memory device 1 has a configuration of an N-channel MOSFET, an electrical resistance value of the channel region 105 may be reduced or lowered because electrons are induced in the channel region 105 when a positive bias is applied to the gate electrode 140. In another embodiment, if the ferroelectric memory device 1 has a configuration of an N-channel MOSFET, the electrical resistance value of the channel region 105 may be increased because electrons densities decrease in the channel region 105 when a negative bias is applied to the gate electrode.

In an embodiment, the ferroelectric layer 120 may include a metal oxide material. The ferroelectric layer 120 may include, for example, a hafnium oxide material, a zirconium oxide material, a hafnium zirconium oxide material, or a combination containing at least two different materials thereof. In an embodiment, the ferroelectric layer 120 may be doped with dopants. The dopants injected into the ferroelectric layer 120 may include carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination containing at least two different elements thereof.

In another embodiment, the ferroelectric layer 120 may include a material having a perovskite crystalline structure. The ferroelectric layer 120 may include, for example, a lead zirconium titanium oxide ($Pb[Zr_xTi_{1-x}]O_3$, where, $0<x<1$) material, a barium titanium oxide ($BaTiO_3$) material, a strontium bismuth tantalum oxide ($SrBi_2Ta_2O_9$) material, a strontium bismuth tantalum niobium oxide ($SrBi_2[Ta_{1-x}, Nb_x]_2O_9$, where, $0<x<1$) material, a bismuth lanthanum titanium oxide ($[Bi, La]_4Ti_3O_{12}$) material, or the like.

The variable resistive memory layer 130 may be disposed on a surface of the ferroelectric layer 120, or interfacial insulation layer 110, on substrate 101. The variable resistive memory layer 130 may have a thickness of approximately five (5) nm to approximately ten (10) nm, and may be disposed to create an interface with the ferroelectric layer 120. The variable resistive memory layer 130 may include a variable resistive material. A resistance value of the variable resistive material may vary according to a voltage or a current applied to the gate electrode 140. In addition, when the voltage or the current applied to the gate electrode 140 is removed, the variable resistive material in the variable resistive memory layer 130 retains or maintains its resistance value. The variable resistive material of the variable resistive memory layer 130 may include, for example, a metal oxide material or a perovskite material which can be utilized as a memory layer of resistive change RAM (RRAM) devices. Alternatively, the variable resistive material of the variable resistive memory layer 130 may include a chalcogenide material which can be utilized as a memory layer of phase change RAM (PCRAM) devices.

In an embodiment, the variable resistive material of the variable resistive memory layer 130 may include a metal oxide material such as a titanium oxide material, an aluminum oxide material, a nickel oxide material, a copper oxide material, a zirconium oxide material, a manganese oxide material, a hafnium oxide material, a tungsten oxide material, a tantalum oxide material, a niobium oxide material, a ferrum oxide material, or a combination material containing at least two different materials thereof. The metal oxide material used in the variable resistive memory layer 130 may have defects such as oxygen vacancies or metal ions.

In another embodiment, the variable resistive material of the variable resistive memory layer 130 may include a perovskite material such as a PCMO($Pr_{1-x}Ca_xMnO_3$, where, $0<x<1$) material, a LCMO($La_{1-x}Ca_xMnO_3$, where, $0<x<1$) material, a BSCFO($Ba_{0.5}Sr_{0.5}Co_{0.8}Fe_{0.2}O_{3-\delta}$) material, a YBCO($YBa_2Cu_3O_{7-x}$, where, $0<x<1$) material, a (Ba,Sr)TiO$_3$(Cr, Nb-doped) material, a SrZrO3(Cr,V-doped) material, a (La, Sr)MnO$_3$ material, a $Sr_{1-x}La_xTiO_3$ (where, $0<x<1$) material, a $La_{1-x}Sr_xFeO_3$ (where, $0<x<1$) material, a $La_{1-x}Sr_xCoO_3$ (where, $0<x<1$) material, a $SrFeO_{2.7}$ material, a $LaCoO_3$ material, a $RuSr_2GdCu_2O_3$ material, a $YBa_2Cu_3O_7$ material, or a combination material containing at least two different materials listed above.

In yet another embodiment, the variable resistive material of the variable resistive memory layer 130 may include a chalcogenide material such as a germanium-stibium-tellurium (GST) material, an arsenide-stibium-tellurium (As—Sb—Te) material, a tin-stibium-tellurium (Sn—Sb—Te) material, a tin-indium-stibium-tellurium (Sn—In—Sb—Te) material, an arsenide-germanium-stibium-tellurium (As—Ge—Sb—Te) material, or a combination material containing at least two different materials listed above.

In still another embodiment, the variable resistive material of the variable resistive memory layer 130 may be a material including oxygen vacancies or metal ions. For example, the variable resistive memory layer 130 may include a $Ge_xSe_{1-x}$ material doped with tellurium or copper, a $Ag_2S$ material, a $Cu_2S$ material, a CdS material, a ZnS material, a $CeO_2$ material, or a carbon material.

Referring again to FIG. 1, the gate electrode 140 may be disposed on a surface of the variable resistive memory layer 130 opposite to the ferroelectric layer 120. The gate electrode 140 may include a conductive material. For example, the conductive material used as the gate electrode 140 may include a metal material, a metal nitride material, a metal oxide material, a metal silicide material, a doped semiconductor material, or a combination material containing at least two different materials thereof. Specifically, the gate electrode 140 may include a tungsten material, an aluminum material, a copper material, a tantalum material, a titanium material, a gold material, a silver material, a ruthenium material, an iridium material, a molybdenum material, a tungsten nitride material, an aluminum nitride material, a titanium nitride material, a tantalum nitride material, a molybdenum nitride material, a niobium nitride material, a titanium silicon nitride material, a titanium aluminum nitride material, a titanium boron nitride material, a zirconium silicon nitride material, a tungsten silicon nitride material, a tungsten boron nitride material, a zirconium aluminum nitride material, a molybdenum silicon nitride material, a molybdenum aluminum nitride material, a tantalum silicon nitride material, a tantalum aluminum nitride material, a ruthenium nitride material, a doped silicon material, or a combination containing at least two different materials listed above.

The source region 102 and the drain region 103 may be respectively disposed at both sides or opposite ends of the channel region 105 located under the gate pattern 10. In an embodiment, if the substrate 101 has a P-type conductivity, the source region 102 and the drain region 103 may be N-type regions which are doped with N-type impurities. The source region 102 and the drain region 103 may supply carriers, which drift in the channel region 105, when an operation voltage is applied between the source region 102 and the drain region 103. An operation current flowing through the channel region 105 therefore depends on a resistance value of the channel region 105.

According to an embodiment of the present disclosure, a resistance value of the variable resistive memory layer 130 and a polarization direction of the ferroelectric layer 120 may vary according to a voltage applied between the gate electrode 140 and the substrate 101. In an embodiment, the variable resistive memory layer 130 may have a first resistive state corresponding to a relatively low resistive state or a second resistive state corresponding to a relatively high resistive state. In addition, an absolute value of a remanent polarization in the ferroelectric layer 120 may vary according to a resistance value of the variable resistive memory layer 130. For example, an absolute value of the remanent polarization in the ferroelectric layer 120 when the variable resistive memory layer 130 has the first resistive state (i.e., a relatively low resistive state) may be greater than an absolute value of the remanent polarization in the ferroelectric layer 120 when the variable resistive memory layer 130 has the second resistive state (i.e., a relatively high resistive state).

As a result, the number of the remanent polarization levels that the ferroelectric layer 120 can have may be increased by increasing the number of potential resistance states that the variable resistive memory layer 130 can have. As the number of the remanent polarization levels increase, the number of resistance states that the channel region 105 can have may also increase. Accordingly, the ferroelectric memory device 1 described herein can act as a multi-level cell to store at least two-bit nonvolatile data. The nonvolatile data stored in the ferroelectric memory device 1 is more stable and can be more reliably read or determined.

Figure 2:
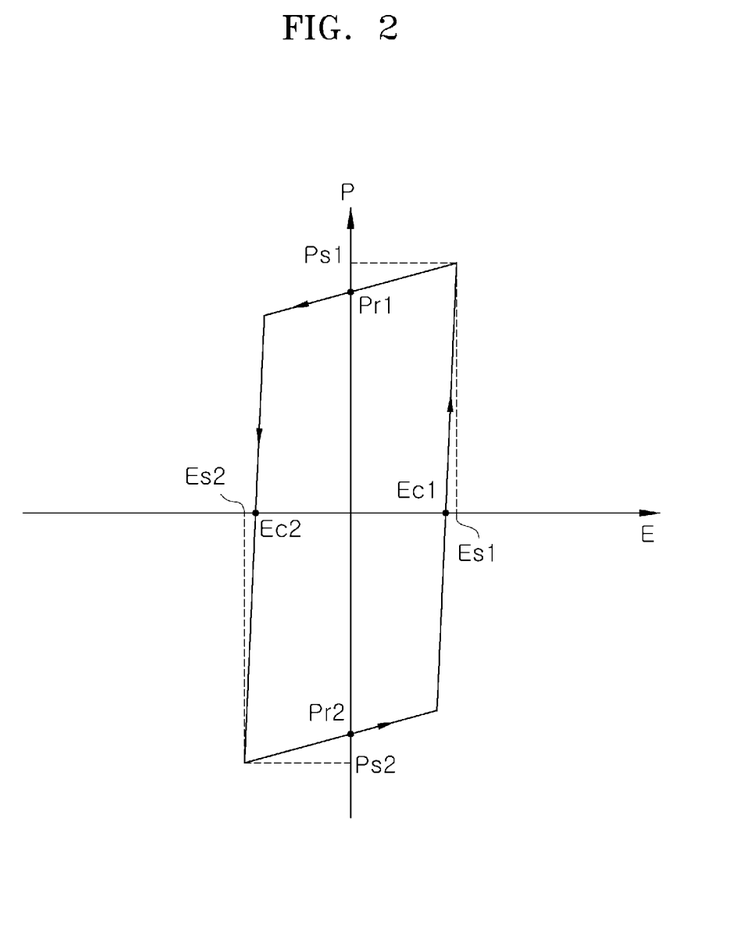
FIG. 2 is a graph illustrating a hysteresis loop of a ferroelectric layer employed in a ferroelectric memory device according to embodiments of the present disclosure.
Figure 3:
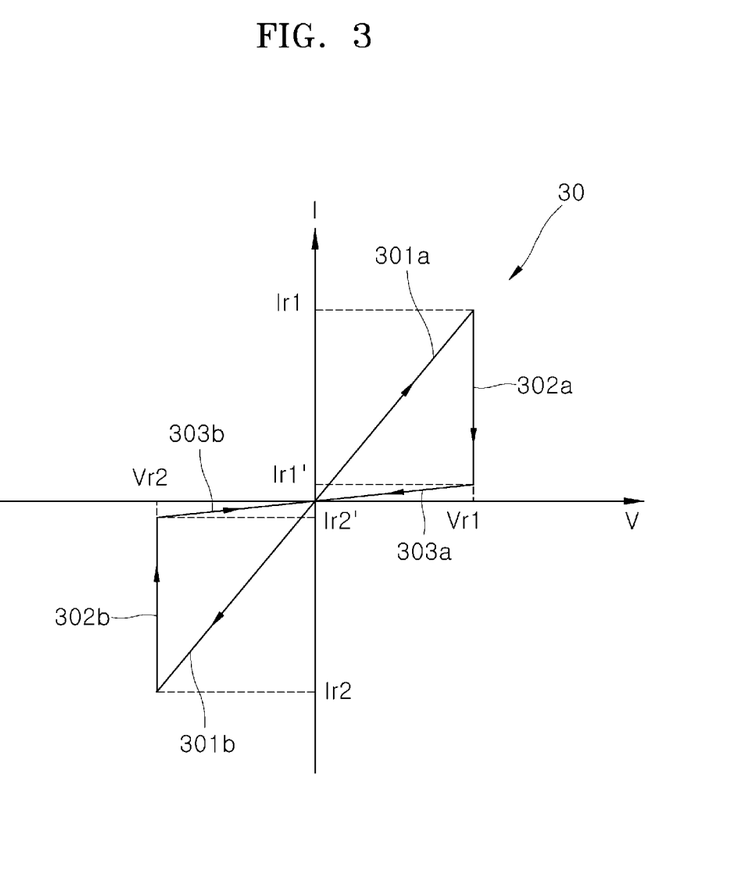
FIGS. 3 and 4 are graphs illustrating I-V characteristics of a variable resistive memory layer employed in a ferroelectric memory device according to embodiments of the present disclosure.
Figure 4:
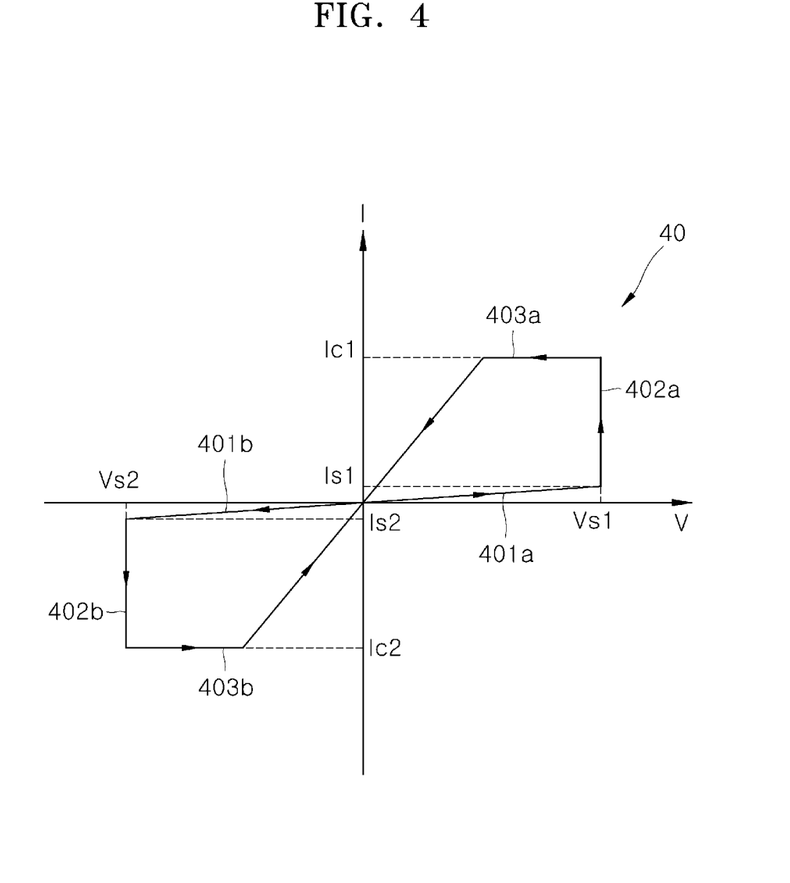

FIG. 2 is a graph illustrating a hysteresis loop of a ferroelectric layer employed in a ferroelectric memory device according to embodiments of the present disclosure. FIGS. 3 and 4 are graphs illustrating current versus voltage (I-V) characteristics of a variable resistive memory layer employed in a ferroelectric memory device according to embodiments of the present disclosure. In FIG. 2, the abscissa denotes an electric field E applied to the ferroelectric layer, and the ordinate denotes intensity (P) of polarization in the ferroelectric layer. In each of FIGS. 3 and 4, the abscissa denotes a voltage V applied to the variable resistive memory layer, and the ordinate denotes a current I flowing through the variable resistive memory layer. The ferroelectric layer and the variable resistive memory layer may correspond to the ferroelectric layer 120 and the variable resistive memory layer 130 described above and with reference to FIG. 1, respectively.

Referring to FIG. 2, the ferroelectric layer may have a first remanent polarization intensity Pr1 and a second remanent polarization intensity Pr2. In an embodiment, the ferroelectric layer has the second remanent polarization intensity Pr2 as an initial state. if a voltage applied to the ferroelectric layer increases in a positive direction so that a positive field E positioned across the ferroelectric layer is stronger than a first coercive field Ec1, a polarization direction of the ferroelectric layer may be switched. Subsequently, if the voltage applied to the ferroelectric layer further increases to create a first saturation field Es1 positioned across the ferroelectric layer and is lowered to a ground voltage, then the ferroelectric layer may retain the first remanent polarization intensity Pr1. Next, if the voltage applied to the ferroelectric layer increases in a negative direction so that a negative field E is formed across the ferroelectric layer is stronger than a second coercive field Ec2, a polarization direction of the ferroelectric layer may be switched. Subsequently, if the voltage applied to the ferroelectric layer increases in strength to create a second saturation field Es2 across the ferroelectric layer, and is lowered to a ground voltage, then the ferroelectric layer may retain the second remanent polarization intensity Pr2. In another embodiment, the ferroelectric layer has the first remanent polarization intensity Pr1 as an initial state. if a voltage applied to the ferroelectric layer increases in a negative direction so that a negative field E positioned across the ferroelectric layer is stronger than the second coercive field Ec2, a polarization direction of the ferroelectric layer may be switched. Subsequently, if the voltage applied to the ferroelectric layer further increases to create the second saturation field Es2 positioned across the ferroelectric layer and is lowered to a ground voltage, then the ferroelectric layer may retain the second remanent polarization intensity Pr2. Next, if the voltage applied to the ferroelectric layer increases in a positive direction so that a positive field E is formed across the ferroelectric layer is stronger than the first coercive field Ec1, a polarization direction of the ferroelectric layer may be switched. Subsequently, if the voltage applied to the ferroelectric layer increases in strength to create the first saturation field Es1 across the ferroelectric layer, and is lowered to a ground voltage, then the ferroelectric layer may retain the first remanent polarization intensity Pr1.

A first saturation polarization intensity Ps1 corresponding to the first saturation field Es2 and a second saturation polarization intensity Ps2 corresponding to the second saturation field Es2 are illustrated in FIG. 2. In an embodiment, the field E across the ferroelectric layer is removed to form the remanent polarization in the ferroelectric layer, even after the field E subsequently increases and becomes stronger than absolute values of the first and second saturation fields Es1 and Es2. As a result, the intensity of the remanent polarization in the ferroelectric layer may be maximized at Ps1 and Ps2.

FIG. 3 is a graph illustrating an I-V characteristic of a reset operation of the variable resistive memory layer employed in a ferroelectric memory device according to embodiments of the present disclosure, and FIG. 4 is a graph illustrating an I-V characteristic of a set operation of the variable resistive memory layer employed in a ferroelectric memory device according to embodiments of the present disclosure. The reset operation means an operation in which a resistance value of the variable resistive memory layer is changed from a low resistive state into a high resistive state, while the set operation means an operation in which a resistance value of the variable resistive memory layer is changed from a high resistive state into a low resistive state.

Referring to FIG. 3, the voltage V may be applied to the variable resistive memory layer that has a low resistive state as its initial resistive state. If the voltage V applied to the variable resistive memory layer increases in a positive direction, the current I flowing through the variable resistive memory layer may linearly increase along a first line 301a of a graph 30 shown in FIG. 3. If the voltage V applied to the variable resistive memory layer reaches a first reset voltage Vr1, a resistive state of the variable resistive memory layer may change from a low resistive state into a high resistive state so that the current I flowing through the variable resistive memory layer is reduced from a first threshold current Ir1 into a first reset current Ir1' along a second line 302a of the graph 30. If the voltage V applied to the variable resistive memory layer and then is lowered to a ground voltage, then the current I flowing through the variable resistive memory layer may be reduced along a third line 303a of the graph 30. In such a case, if the voltage V applied to the variable resistive memory layer increases again in the positive direction, the current I flowing through the variable resistive memory layer may increase back along the third line 303a, instead of line 301a, of the graph 30. That is, the variable resistive memory layer may maintain a high resistive state after a reset operation.

Referring again to FIG. 3, the voltage V may be applied to the variable resistive memory layer having a low resistive state as its initial resistive state. If the voltage V applied to the variable resistive memory layer increases in a negative direction, an absolute value of the current I flowing through the variable resistive memory layer may linearly increase along a fourth line 301b of the graph 30 shown in FIG. 3. If the voltage V applied to the variable resistive memory layer increases in a negative direction to reach a second reset voltage Vr2, a resistive state of the variable resistive memory layer may change from a low resistive state into a high resistive state so that the current I flowing through the variable resistive memory layer is reduced from a second threshold current Ir2 to a second reset current Ir2' along a fifth line 302b of the graph 30. If the voltage V applied to the variable resistive memory layer and then is lowered to a ground voltage, an absolute value of the current I flowing through the variable resistive memory layer may be reduced along a sixth line 303b of the graph 30. In such a case, if the voltage V applied to the variable resistive memory layer increases again in the negative direction, an absolute value of the current I flowing through the variable resistive memory layer may increase back along the sixth line 303b, instead of line 301b, of the graph 30. That is, the variable resistive memory layer may maintain a high resistive state after a reset operation.

Referring to FIG. 4, the voltage V may be applied to the variable resistive memory layer having a high resistive state as its initial resistive state. If the voltage V applied to the variable resistive memory layer increases in a positive direction, the current I flowing through the variable resistive memory layer may gradually increase along a first line 401a of a graph 40 shown in FIG. 4. If the voltage V applied to the variable resistive memory layer reaches a first set voltage Vs1, a resistive state of the variable resistive memory layer may change from a high resistive state into a low resistive state so that the current I flowing through the variable resistive memory layer increases from a first threshold current Is1 to a first set current Ic1 along a second line 402a of the graph 40. As illustrated in FIG. 4, a maximum allowable current (current compliance) may be set to the first set current Ic1 during application of the voltage V to prevent the variable resistive memory layer from being damaged when a large amount of current flows through the variable resistive memory layer in a low resistive state. If the voltage V applied to the variable resistive memory layer and then is lowered to a ground voltage, then the current I flowing through the variable resistive memory layer may be reduced along a third line 403a of the graph 40. In such a case, if the voltage V applied to the variable resistive memory layer increases again in the positive direction, the current I flowing through the variable resistive memory layer may increase back along the third line 403a of the graph 40. That is, the variable resistive memory layer may maintain a low resistive state after a set operation. The first set voltage Vs1 shown in FIG. 4 may be higher than the first reset voltage Vr1 shown in FIG. 3.

Referring again FIG. 4, the voltage V may be applied to the variable resistive memory layer having a high resistive state as its initial resistive state. If the voltage V applied to the variable resistive memory layer increases in a negative direction, an absolute value of the current I flowing through the variable resistive memory layer may gradually increase along a fourth line 401b of the graph 40 shown in FIG. 4. If the voltage V applied to the variable resistive memory layer increases in the negative direction to reach a second set voltage Vs2, a resistive state of the variable resistive memory layer may change from a high resistive state into a low resistive state so that an absolute value of the current I flowing through the variable resistive memory layer increases from a second threshold current Is2 to a second set current Ic2 along a fifth line 402b of the graph 40. As illustrated in FIG. 4, a maximum allowable current (current compliance) may be set to the second set current Ic2 during application of the voltage V to prevent the variable resistive memory layer from being damaged when a large amount of current flows through the variable resistive memory layer having a low resistive state. If the voltage V applied to the variable resistive memory layer is then lowered to a ground voltage, then an absolute value of the current I flowing through the variable resistive memory layer may be reduced along a sixth line 403b of the graph 40. In such a case, if the voltage V applied to the variable resistive memory layer increases again in the negative direction, an absolute value of the current I flowing through the variable resistive memory layer may increase back along the sixth line 403b of the graph 40. That is, the variable resistive memory layer may maintain a low resistive state after a set operation. An absolute value of the second set voltage Vs2 shown in FIG. 4 may be higher than an absolute value of the first reset voltage Vr2 shown in FIG. 3.

In the event that a ferroelectric layer and a variable resistive memory layer, having characteristics described by hysteresis loop and the I-V graphs of FIGS. 2 to 4, are employed as the ferroelectric layer 120 and the variable resistive memory layer 130 of the ferroelectric memory device 1 illustrated in FIG. 1, then the smallest absolute value among the first and second reset voltages Vr1 and Vr2 and the first and second set voltages Vs1 and Vs2 of the variable resistive memory layer may be greater than a voltage corresponding to a largest value of absolute values of the first and second coercive fields Ec1 and Ec2 of the ferroelectric layer. More specifically, the smallest value among absolute values of the first and second reset voltages Vr1 and Vr2 and the first and second set voltages Vs1 and Vs2 of the variable resistive memory layer may be greater than a voltage corresponding to the largest absolute value of the first and second saturation fields Es1 and Es2 of the ferroelectric layer.

That is, after a resistive state of the variable resistive memory layer is firstly and stably controlled, polarization of the ferroelectric layer may be more reliably controlled. The variable resistive memory layer may be switched to have a high resistive state or a low resistive state if a voltage higher than absolute values of the first and second reset voltages Vr1 and Vr2 or the first and second set voltages Vs1 and Vs2 is applied to the variable resistive memory layer. In other words, after the variable resistive memory layer is switched by a predetermined voltage to have a high resistive state or a low resistive state, the polarization of the ferroelectric layer may be controlled under the influence of the resistive state retained by the variable resistive memory layer.

Figure 5:
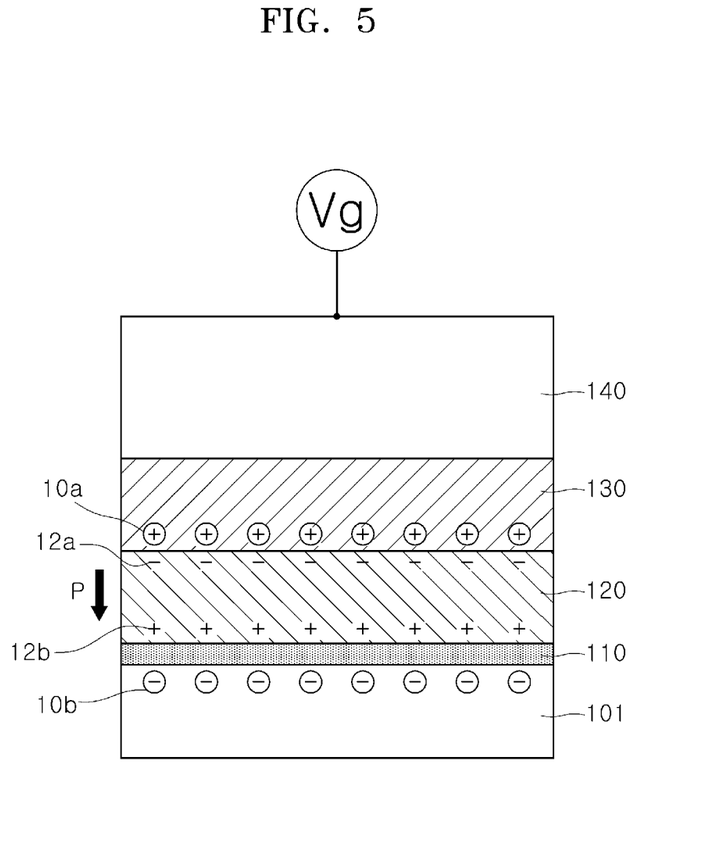
FIGS. 5 and 6 are cross-sectional views illustrating operations of a ferroelectric memory device according to embodiments of the present disclosure.
Figure 6:
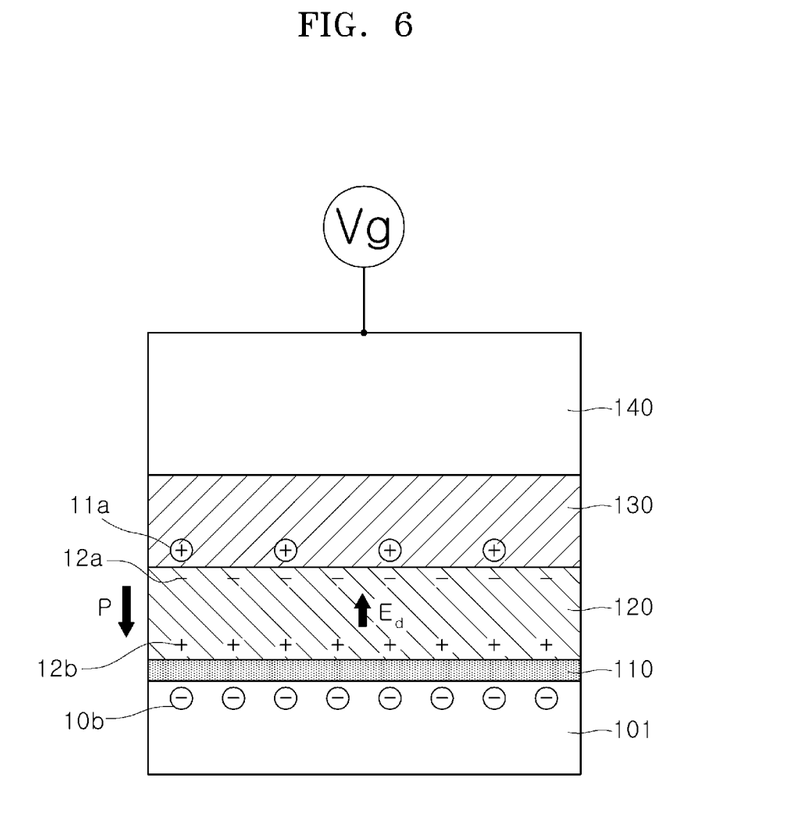
Figure 7:
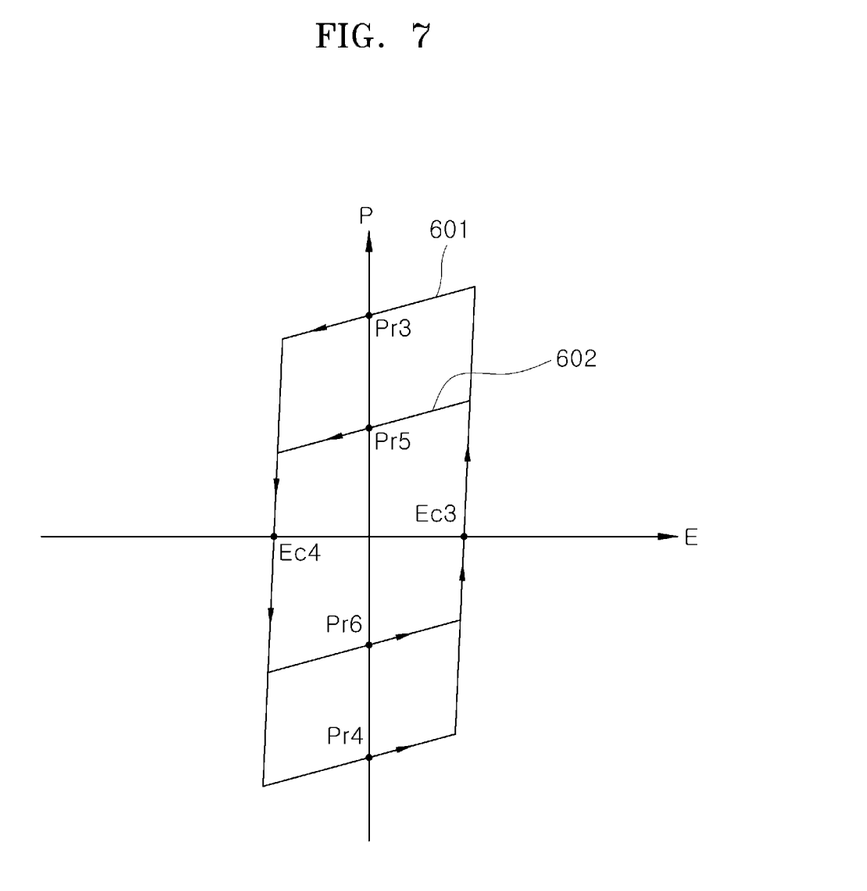
FIG. 7 is a graph illustrating hysteresis loops of a ferroelectric layer employed in a ferroelectric memory device according to embodiments of the present disclosure.

FIGS. 5 and 6 are cross-sectional views illustrating operations of a ferroelectric memory device according to embodiments of the present disclosure. FIG. 7 is a graph illustrating hysteresis loops of a ferroelectric layer employed in a ferroelectric memory device according to embodiments of the present disclosure. The ferroelectric memory device described with reference to FIGS. 5 to 7 may correspond to the ferroelectric memory device 1 described above and with reference to FIG. 1. In addition, the ferroelectric memory device described with reference to FIGS. 5 to 7 may include the ferroelectric layer and the variable resistive memory layer having the characteristics described above and with reference to FIGS. 2 to 4.

FIG. 5 illustrates the polarization state of the ferroelectric layer 120 when the variable resistive memory layer 130 of the ferroelectric memory device 1 has a low resistive state, and FIG. 6 illustrates the polarization state of the ferroelectric layer 120 when the variable resistive memory layer 130 of the ferroelectric memory device 1 has a high resistive state.

Referring to FIG. 5, the variable resistive memory layer 130 may have a low resistive state as its initial resistive state. The low resistive state of the variable resistive memory layer 130 may be stably obtained by applying the first set voltage Vs1 to the variable resistive memory layer 130 in an earlier operation. In an embodiment, the variable resistive memory layer 130 having the low resistive state may be regarded as a conductor or a conductive layer.

Referring still to FIG. 5, a gate voltage Vg may be applied to the gate electrode 140. If the gate voltage Vg increases in a positive direction to generate at least the first saturation field Es1 illustrated in FIG. 2 across the ferroelectric layer 120, then polarization P, aligned in a direction from the variable resistive memory layer 130 toward the substrate 101, may be formed in the ferroelectric layer 120.

The polarization P formed in the ferroelectric layer 120 may induce negative charges 12a to collect at or near an interface between ferroelectric layer 120 and variable resistive memory layer 130. In addition, the polarization P formed in the ferroelectric layer 120 may induce positive charges 12b to move toward or collect at an interface between the ferroelectric layer 120 and the interfacial insulation layer 110 or substrate 101. As shown in FIG. 5, the negative charges 12a and the positive charges 12b are positioned in the ferroelectric layer 120. When the variable resistive memory layer 130 has a low resistive state, the negative charges 12a may be fully screened by positive charges 10a in the variable resistive memory layer 130, which are induced to collect at or near the interface of the variable resistive memory layer 130 and ferroelectric layer 120. The positive charges 10a may be induced at an interface between the ferroelectric layer 120 and the variable resistive memory layer 130 by a repulsive force between the negative charges 12a in the ferroelectric layer 120 and electrons in the variable resistive memory layer 130.

Similarly, the positive charges 12b in the ferroelectric layer 120 may be fully screened by negative charges 10b which are induced in a channel region of the substrate 101 adjacent to the ferroelectric layer 120 or interfacial insulation layer 110. Accordingly, there is no depolarization field opposite to the polarization P in the ferroelectric layer 120. Thus, after the gate voltage Vg is removed, the ferroelectric layer 120 may be strongly polarized and have characteristics illustrated by a first hysteresis loop 601 in FIG. 7. As a result, the ferroelectric layer 120 may have a positive remanent polarization intensity Pr3 illustrated in FIG. 7.

Referring to FIG. 6, the variable resistive memory layer 130 may have a high resistive state as its initial resistive state. The high resistive state of the variable resistive memory layer 130 may be stably obtained by applying the first reset voltage Vr1 to the variable resistive memory layer 130 in an earlier operation. In an embodiment, the variable resistive memory layer 130 having the high resistive state may be regarded as an insulator or an insulating layer. In another embodiment, the variable resistive memory layer 130 having the high resistive state may be regarded as a resistor or a resistive layer that has increased resistivity, compared with the variable resistive memory layer 130 having the low resistive state. At this time, the variable resistive memory layer 130 having the high resistive state may not have enough free electrons that respond to negative charges 12a generated by polarization P in the ferroelectric layer 120, as described below.

Referring still to FIG. 6, the gate voltage Vg may be applied to the gate electrode 140. If the gate voltage Vg increases in a positive direction to form at least the first saturation field Es1 illustrated in FIG. 2 across the ferroelectric layer 120, then the polarization P, aligned in a direction from the variable resistive memory layer 130 toward the substrate 101, may be formed in the ferroelectric layer 120.

The polarization P formed in the ferroelectric layer 120 may induce negative charges 12a to collect at or near an interface between ferroelectric layer 120 and variable resistive memory layer 130. In addition, the polarization P formed in the ferroelectric layer 120 may induce positive charges 12b towards an interface of the ferroelectric layer 120 and interfacial insulation layer 110 or substrate 101. As shown in FIG. 6, the negative charges 12a and the positive charges 12b are positioned in the ferroelectric layer 120. When the variable resistive memory layer 130 has a high resistive state, the variable resistive memory layer 130 having the high resistive state does not have enough free electrons, so the negative charges 12a may not be fully screened by positive charges 11a in the variable resistive memory layer 130. In contrast, the positive charges 12b may be fully screened by the negative charges 10b which are induced at or near the interface of the ferroelectric layer 120 and interfacial insulation layer 110 or substrate 101.

The negative charges 12a, which are not fully screened by the positive charges 11a in the variable resistive memory layer 130, may contribute to a depolarization field Ed in the ferroelectric layer 120. The depolarization field Ed may have a direction opposite to that of polarization P. Thus, after the gate voltage Vg is removed, the ferroelectric layer 120 may be weakly polarized and have characteristics described by a second hysteresis loop 602 illustrated in FIG. 7. That is, the depolarization field Ed may disturb or interfere with the polarization P of the ferroelectric layer 120. Accordingly, after the gate voltage Vg is removed, the ferroelectric layer 120 may have a positive remanent polarization intensity Pr5 which is weaker than the positive remanent polarization intensity Pr3.

Although it is not illustrated, the gate voltage Vg is increased in a negative direction to generate at least the second saturation field Es2 illustrated in FIG. 2 across the ferroelectric layer 120, and then the gate voltage Vg is removed from the ferroelectric layer 120. As a result, the ferroelectric layer 120 may have negative remanent polarization intensities Pr4 and Pr6 in FIG. 7. In a case that the variable resistive memory layer 130 has a low resistive state, the ferroelectric layer 120 may have the negative remanent polarization intensity Pr4. In another case that the variable resistive memory layer 130 has a high resistive state, the ferroelectric layer 120 may have the negative remanent polarization intensity Pr6 that is weaker than the negative remanent polarization intensity Pr4, due to the depolarization field generated in the ferroelectric layer 120 in substantially the same manner as described with respect to FIGS. 5 and 6.

Referring to FIG. 7, if the variable resistive memory layer 130 has a low resistive state, the ferroelectric layer 120 may be polarized along the first hysteresis loop 601. For example, if the variable resistive memory layer 130 has a low resistive state, the ferroelectric layer 120 may have relatively strong positive remanent polarization intensity Pr3 or negative remanent polarization intensity Pr4, depending on the direction of the bias of the gate voltage Vg. In contrast, if the variable resistive memory layer 130 has a high resistive state, the ferroelectric layer 120 may be polarized along the second hysteresis loop 602. For example, if the variable resistive memory layer 130 has a high resistive state, the ferroelectric layer 120 may have relatively weak positive remanent polarization intensity Pr5 or negative remanent polarization intensity Pr6, depending on the polarity of the gate voltage Vg.

In embodiments, the remanent polarization intensity of the ferroelectric layer 120 may vary according to a resistive state of the variable resistive memory layer 130 in response to specific coercive fields Ec3 and Ec4, as illustrated in FIG. 7. That is, the polarization of the ferroelectric layer 120 included in the ferroelectric memory device 1 may be effectively controlled or modified using a resistive state of the variable resistive memory layer 130 to have any one of a plurality of different remanent polarization values.

As described above, a ferroelectric memory device according to an embodiment may include a ferroelectric layer and a variable resistive memory layer stacked or inserted between a substrate and a gate electrode. In such a case, a hysteresis loop of the ferroelectric layer may vary according to a resistive state of the variable resistive memory layer. That is, if the variable resistive memory layer has a relatively low resistive state, the ferroelectric layer may be programmed to have a relatively strong remanent polarization. Alternatively, if the variable resistive memory layer has a relatively high resistive state, the ferroelectric layer may be programmed to have a relatively weak remanent polarization.

As a result, the ferroelectric layer may have one of a plurality of different remanent polarization values, according to a resistive state of the variable resistive memory layer and a magnitude of the gate voltage, to provide a multi-level memory cell. A channel current of the ferroelectric memory device may be determined according to a channel resistance value of a channel region, which is influenced by the remanent polarization of the ferroelectric layer. Thus, multi-bit data (e.g., two-bit data) stored or programmed in the ferroelectric memory device may be read out by sensing the channel current of the ferroelectric memory device in a read mode.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A ferroelectric memory device comprising:
   a substrate; and
   a ferroelectric layer, a variable resistive memory layer and a gate electrode which are sequentially stacked on a surface of the substrate,
   wherein the ferroelectric layer has any one of a plurality of different remanent polarization values depending on a resistive state of the variable resistive memory layer,
   wherein the resistive state of the variable resistive memory layer varies according to a voltage applied between the gate electrode and the substrate, and
   wherein an absolute value of a first voltage for switching a resistance value of the variable resistive memory layer is greater than an absolute value of a second voltage for switching polarization of the ferroelectric layer, and
   wherein the gate electrode comprises at least one of a tungsten material, an aluminum material, a copper material, a tantalum material, a titanium material, a gold material, a silver material, a ruthenium material, an iridium material, a molybdenum material, a tungsten nitride material, an aluminum nitride material, a titanium nitride material, a tantalum nitride material, a molybdenum nitride material, a niobium nitride material, a titanium silicon nitride material, a titanium aluminum nitride material, a titanium boron nitride material, a zirconium silicon nitride material, a tungsten silicon nitride material, a tungsten boron nitride material, a zirconium aluminum nitride material, a molybdenum silicon nitride material, a molybdenum aluminum nitride material, a tantalum silicon nitride material, a tantalum aluminum nitride material, a ruthenium nitride material and a doped silicon material.

2. The ferroelectric memory device of claim 1, wherein the variable resistive memory layer includes at least one of a titanium oxide material, an aluminum oxide material, a nickel oxide material, a copper oxide material, a zirconium oxide material, a manganese oxide material, a hafnium oxide material, a tungsten oxide material, a tantalum oxide material, a niobium oxide material and a ferrum oxide material.

3. The ferroelectric memory device of claim 2, wherein the ferroelectric layer has a thickness of approximately 5 nm to approximately 15 nm; and
wherein the variable resistive memory layer has a thickness of approximately 5 nm to approximately 10 nm.

4. The ferroelectric memory device of claim 1, wherein the variable resistive memory layer includes at least one of a PCMO($Pr_{1-x}Ca_xMnO_3$, where, $0<x<1$) material, a LCMO ($La_{1-x}Ca_xMnO_3$, where, $0<x<1$) material, a BSCFO ($Ba_{0.5}Sr_{0.5}Co_{0.8}Fe_{0.2}O_{3-\delta}$) material, a YBCO($YBa_2Cu_3O_{7-x}$, where, $0<x<1$) material, a $(Ba,Sr)TiO_3$(Cr, Nb-doped) material, a $SrZrO_3$(Cr,V-doped) material, a $(La, Sr)MnO_3$ material, a $Sr_{1-x}La_xTiO_3$ (where, $0<x<1$) material, a $La_{1-x}Sr_xFeO_3$ (where, $0<x<1$) material, a $La_{1-x}Sr_xCoO_3$ (where, $0<x<1$) material, a $SrFeO_{2.7}$ material, a $LaCoO_3$ material, a $RuSr_2GdCu_2O_3$ material and a $YBa_2Cu_3O_7$ material.

5. The ferroelectric memory device of claim 1, wherein the variable resistive memory layer includes at least one of a germanium-stibium-tellurium (GST) material, an arsenide-stibium-tellurium (As—Sb—Te) material, a tin-stibium-tellurium (Sn—Sb—Te) material, a tin-indium-stibium-tellurium (Sn—In—Sb—Te) material and an arsenide-germanium-stibium-tellurium (As—Ge—Sb—Te) material.

6. A ferroelectric memory device comprising:
a substrate;
a ferroelectric layer disposed on the substrate;
a variable resistive memory layer disposed on the ferroelectric layer;
a gate electrode disposed on the variable resistive memory layer; and
a source region and a drain region disposed in the substrate to be spaced apart from each other,
wherein an absolute value of a first voltage for switching a resistance value of the variable resistive memory layer is greater than an absolute value of a second voltage for switching polarization of the ferroelectric layer, and
wherein the ferroelectric layer includes at least one of a hafnium oxide material, a zirconium oxide material and a hafnium zirconium oxide material.

7. The ferroelectric memory device of claim 6, wherein the ferroelectric layer further includes at least one of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd) and lanthanum (La) as a dopant element.

8. A ferroelectric memory device comprising:
a substrate;
a ferroelectric layer disposed on the substrate;
a variable resistive memory layer disposed on the ferroelectric layer;
a gate electrode disposed on the variable resistive memory layer; and
a source region and a drain region disposed in the substrate to be spaced apart from each other,
wherein an absolute value of a first voltage for switching a resistance value of the variable resistive memory layer is greater than an absolute value of a second voltage for switching polarization of the ferroelectric layer, and
wherein the variable resistive memory layer includes at least one of a titanium oxide material, an aluminum oxide material, a nickel oxide material, a copper oxide material, a zirconium oxide material, a manganese oxide material, a hafnium oxide material, a tungsten oxide material, a tantalum oxide material, a niobium oxide material and a ferrum oxide material.

* * * * *